United States Patent
Guan

(10) Patent No.: US 10,407,765 B2
(45) Date of Patent: Sep. 10, 2019

(54) EVAPORATION DEVICE

(71) Applicants: Boe Technology Group Co., Ltd., Beijing (CN); Ordos Yuansheng Optoelectronics Co., Ltd., Inner Mongolia (CN)

(72) Inventor: Liwei Guan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 233 days.

(21) Appl. No.: 15/322,540

(22) PCT Filed: Apr. 15, 2016

(86) PCT No.: PCT/CN2016/079437
§ 371 (c)(1),
(2) Date: Dec. 28, 2016

(87) PCT Pub. No.: WO2016/188266
PCT Pub. Date: Dec. 1, 2016

(65) Prior Publication Data
US 2018/0202038 A1    Jul. 19, 2018

(30) Foreign Application Priority Data

May 25, 2015  (CN) .......................... 2015 1 0272145

(51) Int. Cl.
*C23C 14/26* (2006.01)
*H01L 51/56* (2006.01)
(Continued)

(52) U.S. Cl.
CPC ............ *C23C 14/26* (2013.01); *C23C 14/243* (2013.01); *H01L 51/56* (2013.01); *H01L 51/001* (2013.01)

(58) Field of Classification Search
None
See application file for complete search history.

(56) References Cited

U.S. PATENT DOCUMENTS 2,398,382 A  *  4/1946  Lyon ....................... C03C 17/22
                                                    118/725
5,015,342 A  *  5/1991  Ginatta .................... C25C 3/26
                                                    204/243.1
(Continued)

FOREIGN PATENT DOCUMENTS

CN        1393575        1/2003
CN       101329137      12/2008
(Continued)

OTHER PUBLICATIONS

International Search Report for PCT/CN2016/079437 dated Jul. 19, 2016.
(Continued)

*Primary Examiner* — Joseph M Pelham
(74) *Attorney, Agent, or Firm* — Calfee, Halter & Griswold LLP

(57) ABSTRACT

An evaporation device has an evaporation material that can be uniformly heated when it is evaporated with the evaporation device. The evaporation device comprises: a crucible for loading an evaporation material, a body wall of the crucible comprising an inner wall and an outer wall, a chamber being formed between the inner wall and the outer wall, which is filled with an inorganic salt; and a heating element for heating the crucible. During the working process of the evaporation device, when the crucible is heated by the heating element, the inorganic salt inside the chamber would become a molten state under heating, and the inorganic salt in molten state which fills the chamber can conduct heat uniformly such that the temperature distribution of the inner wall of the crucible is more uniform during the heating process and the evaporation material can be heated more uniformly. A method of manufacturing an evaporation (Continued)

device and a usage of the evaporation device are also disclosed in this patent application.

19 Claims, 2 Drawing Sheets

(51) Int. Cl.
   *C23C 14/24* (2006.01)
   *H01L 51/00* (2006.01)

(56) References Cited

U.S. PATENT DOCUMENTS

| | | | | |
|---|---|---|---|---|
| 5,064,497 | A | * | 11/1991 | Clemans ............... C30B 11/002 117/223 |
| 2003/0066638 | A1 | * | 4/2003 | Qu ......................... F24S 10/90 165/186 |
| 2012/0017824 | A1 | * | 1/2012 | Sudo ....................... C30B 15/10 117/13 |

FOREIGN PATENT DOCUMENTS

| | | |
|---|---|---|
| CN | 102268642 | 12/2011 |
| CN | 103757591 | 4/2014 |
| CN | 103966555 | 8/2014 |
| CN | 104947042 | 9/2015 |
| JP | H0293063 A | 4/1990 |
| JP | H0321583 | 9/1991 |
| KR | 20120039873 | 4/2012 |

OTHER PUBLICATIONS

Office Action from China Application No. 201510272145.1 dated Feb. 2, 2017.

* cited by examiner

EVAPORATION DEVICE

RELATED APPLICATIONS

The present application is the U.S. national phase entry of PCT/CN2016/079437, with an international filing date of Apr. 15, 2016, which claims the benefit of Chinese Patent Application No. 201510272145.1, filed on May 25, 2015, the entire disclosures of which are incorporated herein by reference.

TECHNICAL FIELD

The present invention relates to the technical field of evaporation device, and particularly to an evaporation device.

BACKGROUND

At present, screens widely used in the market are liquid crystal displays (LCD) and organic light emitting diode displays (OLED). The OLED is mainly used in small-sized panels. As compared with the LCD, the OLED has advantages including light and thin, low power consumption, high contrast, high color gamut, the ability to achieve flexible display, and so on, and thus represents the development trend of next-generation displays. The OLED includes a passive organic light emitting diode (PMOLED) and an active matrix organic light emitting diode (AMOLED), wherein the AMOLED can be implemented by combining a low temperature polysilicon (LTPS) backboard and a fine metal mask (FMM), or combining an oxide backboard, a white organic light emitting diode (WOLED) and a color film. The former is mainly applied in small-sized panels, corresponding to mobile phones and mobile applications, and the latter is mainly applied in large-sized panels, corresponding to the applications such as monitors and televisions. The manner of utilizing a fine metal mask (FMM) is achieved by vapor deposition of an OLED organic material onto the LTPS backboard by means of vapor deposition in accordance with a predetermined procedure, and forming a red-green-blue device using a pattern on the fine metal mask.

During the preparation process of an existing AMOLED, the vapor deposition of an organic material is mostly carried out in a vacuum chamber using a crucible as an evaporation device. The crucible has a grooved structure for loading the organic evaporation material, and heating wires are provided outside the crucible for heating the crucible. The conventional crucible is heated only by the heating wires, and the uniformity of the heating temperature is achieved only by means of the distribution of the heating wires. However, the heating wires are easily deformed, so that easily results in poor temperature uniformity of the crucible, which may cause the problems such as uneven thickness of the vapor-deposited film layer, denaturation of the material inside the crucible, and so on.

SUMMARY

Embodiments of the present invention provide an evaporation device. The evaporation material can be uniformly heated when it is evaporated with said evaporation device.

To achieve the above objective, in one aspect, embodiments of the present invention provide an evaporation device comprising: a crucible for loading an evaporation material, a body wall of the crucible comprising an inner wall and an outer wall, a chamber being formed between the inner wall and the outer wall, which chamber is filled with inorganic salt; and a heating element for heating the crucible.

During the working process of the evaporation device, when the crucible is heated by the heating element, the inorganic salt inside the chamber would become a molten state under heating, and the inorganic salt in molten state which fills the chamber can conduct heat uniformly such that the temperature distribution of the inner wall of the crucible is more uniform during the heating process and the evaporation material can be heated more uniformly.

In optional embodiments, the inorganic salt is an inorganic salt mixture composed of at least two kinds of inorganic salts. This facilitates flexible adjustment of the evaporation temperature of the evaporation device.

In optional embodiments, the inorganic salt is an inorganic salt mixture composed of 50% by mass of potassium nitrate and 50% by mass of sodium nitrite.

In optional embodiments, the heating element is embedded into the inorganic salt inside the chamber. This makes the temperature of the heating element integrally uniform so as to prevent excessive temperatures in some portions thereof.

In optional embodiments, the heating element is an electrical heating wire.

In optional embodiments, the electrical heating wire comprises a metal wire and an insulating sheath that wraps the metal wire for electrically isolating the metal wire from the inorganic salt. This can prevent denaturation of the inorganic salt resulting from the electrochemical reaction.

In optional embodiments, the crucible is of a grooved structure, the body wall of the crucible comprises a bottom wall and a side wall which cooperate with each other to enclose a grooved structure, and the heating element is located within the side wall.

In optional embodiments, the heating element is further located in the bottom wall.

In optional embodiments, the heating element extends in a zig-zag manner along the extension direction of the side wall.

In optional embodiments, the chamber is a closed chamber.

In optional embodiments, the evaporation device further comprises: a temperature sensor in contact with the outer wall of the crucible for sensing a temperature of the outer wall of the crucible; a temperature controller for controlling a heating temperature of the heating element for the crucible based on the temperature of the outer wall of the crucible which is sensed by the temperature sensor.

In another aspect, embodiments of the present invention provide a manufacturing method of an evaporation device, comprising: preparing a crucible having a body wall consisting of an inner wall and an outer wall, a chamber being formed between the inner wall and outer wall; arranging a heating element within the chamber; filling the chamber with inorganic salt such that the inorganic salt surrounds the heating element; sealing the chamber.

In optional embodiments, the manufacturing method further comprises arranging a temperature sensor on the outer wall.

In a further aspect, embodiments of the present invention propose a usage of the evaporation device described above, wherein the evaporation device is used for vapor deposition of an organic material during preparing an OLED device.

BRIEF DESCRIPTION OF THE DRAWINGS

To describe the technical solutions in embodiments of the present invention more clearly, the drawings needed for describing the embodiments are simply introduced below. Apparently, the drawings in the description below are only some embodiments of the present invention. For those ordinarily skilled in the art, other embodiments can be further obtained based on these drawings without spending inventive efforts. It should be recognized that the embodiments described below are only used for interpreting the objective of the present invention and do not constitute limitation to the scope of the present invention. Moreover, it should be recognized that the drawings are not drawn to scale, and on the contrary, some components may be exaggerated to highlight the creative points of the present invention.

DETAILED DESCRIPTION

The technical solutions in embodiments of the present invention would be clearly and completely described below with reference to the drawings in embodiments of the present invention. Apparently, the embodiments described are just a part of the embodiments of the present invention rather than all of them. All other embodiments obtained by those ordinarily skilled in the art based on the embodiments in the present invention without spending creative efforts fall within the protection scope of the present invention.

Figure 1:
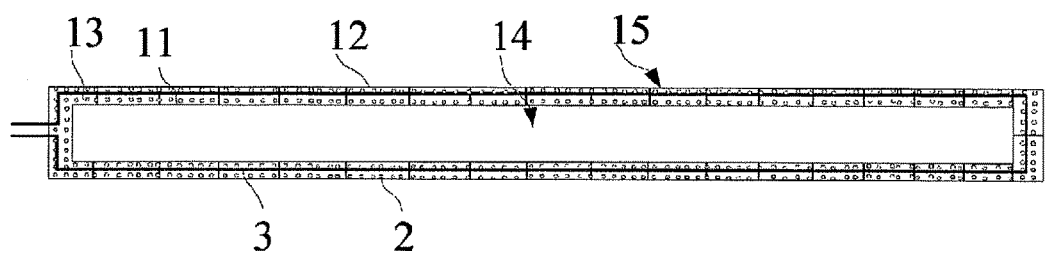
FIG. 1 is a structural schematic view of a cross section of an evaporation device provided by embodiments of the present invention.
Figure 2:
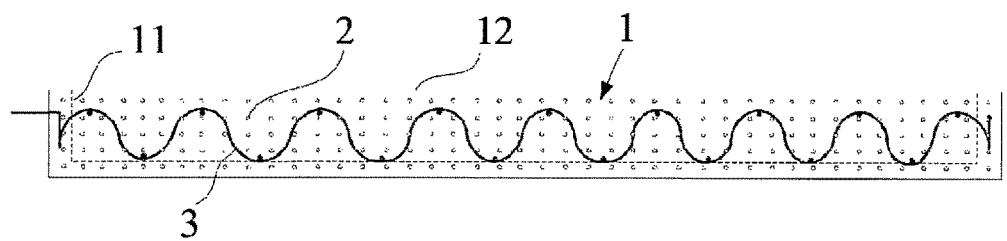
FIG. 2 is a structural schematic view of a section of the side wall of the crucible of the evaporation device shown in FIG. 1.

As shown in FIGS. 1 and 2, an evaporation device provided by embodiments of the present invention comprises: a crucible 1 for loading an evaporation material, wherein a body wall of the crucible 1 comprises an inner wall 11 and an outer wall 12, and a chamber 13 is formed between the inner wall 11 and the outer wall 12, which is filled with an inorganic salt 12; and a heating element 3 for heating the crucible 1.

During the working process of the above evaporation device, when the crucible 1 is heated by the heating element 3, the inorganic salt 2 inside the chamber 13 would become a molten state under heating, and the inorganic salt 2 in molten state in the chamber 13 can conduct heat uniformly such that the temperature distribution of the inner wall 11 of the crucible 1 is more uniform during the heating process, thereby the evaporation material can be heated more uniformly.

Consequently, the heating uniformity of the evaporation material is relatively good when the evaporation is performed using the above evaporation device. Therefore, when the organic material is vapor-deposited by the above evaporation device, the thickness of the vapor-deposited film layer is uniform and the denaturation of the organic material would not take place.

In a specific embodiment, the material of the crucible 1 may be the same as that of a conventional crucible. Specifically, the body wall of the crucible 1 may be made of a metallic titanium material to ensure that the crucible 1 has sufficient strength so that it is undeformed at high temperatures.

In a specific embodiment, the inorganic salt 2 filled in the chamber 13 may be a pure substance of a certain inorganic salt or a mixture of inorganic salts. The pure substances of different types of inorganic salts or the mixtures of inorganic salts have different operating temperatures in molten state. Table 1 shows melting temperatures and operating temperatures of some inorganic salt pure substances and inorganic salt mixtures. The inorganic salt in the above evaporation device can be selected dependent on the evaporation temperature range of the evaporation material. In particular, the operating temperature range of the selected inorganic salt needs to include the evaporation temperature range of the evaporation material. Certainly, the composition ratio of the selected inorganic salt in the above evaporation device is not limited to the component ratios of the inorganic salts as provided in Table 1.

TABLE 1

Composition ratios and operating temperature ranges of common inorganic salts

| Ratios of salt components in percent by mass | Melting temperature ° C. | Operating temperature ° C. |
| --- | --- | --- |
| 100% $BaCl_2$ | 960 | 1100~1300 |
| 85%~95% $BaCl_2$ + 15%~5% NaCl | 760~850 | 900~1000 |
| 70%~80% $BaCl_2$ + 30%~20% NaCl | 635~700 | 750~1000 |
| 50% $BaCl_2$ + 50% NaCl | 640 | 700~900 |
| 50% KCl + 50% NaCl | 670 | 720~950 |
| 50% $BaCl_2$ + 30% KCl + 20% NaCl | 560 | 580~880 |
| 100% $KNO_3$ | 337 | 350~600 |
| 100% $NaNO_3$ | 317 | 350~600 |
| 50% $KNO_3$ + 50% $NaNO_3$ | 218 | 230~550 |
| 50% $KNO_3$ + 50% $NaNO_2$ | 140 | 150~550 |
| 55% $KNO_3$ + 45% $NaNO_2$ (additional 3%~5% $H_2O$) | 137 | 150~360 |

In a specific embodiment, the inorganic salt 2 filled in the chamber 13 may be a mixture of two kinds of inorganic salts. Preferably, the inorganic salt 2 filled in the chamber 13 is an inorganic salt mixture formulated by 50% by mass of potassium nitrate and 50% by mass of sodium nitrite. From Table 1 above, it is clear that the operating temperature of the inorganic salt mixture composed of 50% by mass of potassium nitrate and 50% by mass of sodium nitrite is 150 to 550° C. However, during the preparation process of an existing OLED display, the evaporation temperature of the organic material ranges from 170 to 400° C., i.e. the operating temperature range of the above inorganic salt mixture includes the evaporation temperature range of the organic material during the preparation process of the OLED display. Therefore, the evaporation device with the chamber 13 filled with the above inorganic salt mixture can be used for vapor deposition of the organic material during the preparation process of the OLED display.

As shown in FIGS. 1 and 2, on the basis of the above embodiments, in a specific embodiment, the heating element 3 is embedded into the inorganic salt 2 inside the chamber 13.

The heating element 3 is embedded into the inorganic salt 2 inside the chamber 13, thus the heating element 3 can directly heat the inorganic salt 2 to make it molten. The body wall of the crucible 1 is then heated by means of the heat conduction of the inorganic salt 2 in molten state. Since the heating element 3 is located within the chamber, it can heat the inner wall 11 of the crucible 1 to a temperature required for evaporation more quickly. Furthermore, since the inner wall 11 of the crucible 1 is completely heated by the heat conduction of the inorganic salt 2 in molten state, the temperature distribution of the inner wall 11 of the crucible 1 is more uniform. In the prior art, a conventional crucible heated by metal wires has an integral temperature uniformity of ±10% to ±20% during the working process, which easily leads to the problems such as uneven thickness of the vapor-deposited film layer, denaturation of the organic material, and so on. However, as for the crucible 1 according to embodiments of the present invention which is heated by the inorganic salt 2 in the interlayer of the body wall, the heating temperature is uniform and the temperature uniformity can be less than ±10%, thereby effectively preventing occurrence of the problems such as uneven thickness of the vapor-deposited film layer, denaturation of the organic material, and so on. Furthermore, since the heating element 3 is embedded in the inorganic salt, the temperature of the heating element 3 can be quickly conducted away when it is heated so that the temperatures of various portions of the heating element 3 can be kept uniform and stable. Therefore, it is possible to prevent excessive temperatures in some portions of the heating element 3 during a long-term operation, which result in damage and frequent replacement thereof.

As shown in FIGS. 1 and 2, on the basis of the above embodiments, in a specific embodiment, the heating element 3 may be an electrical heating wire. Preferably, the electrical heating wire may comprise a metal wire and an insulating sheath that wraps the metal wire for electrically isolating the metal wire from the outside. When the electrical heating wire is embedded in the inorganic salt 2 inside the chamber 13, electrical isolation between the metal wire and the inorganic salt 2 can be ensured by the insulating sheath, thereby preventing the denaturation of the inorganic salt 2 resulting from the electrochemical reaction. The arrangement of the inorganic salt 2 in the chamber 13 is only shown schematically in the figures. In practice, the inorganic salt 2 would not exhibit the array arrangement shown in the figures and preferably fills the entire chamber.

As shown in FIGS. 1 and 2, on the basis of the above embodiments, in a specific embodiment, the crucible 1 may have a grooved structure, and the body wall of the crucible 1 may comprise a bottom wall 14 and a side wall 15 which enclose a grooved structure. The heating element 3 is located in the interlayer of the side wall 15. That is, the heating element 3 is located within the area of the side wall 15 of the chamber 13.

As shown in FIGS. 1 and 2, on the basis of the above embodiments, preferably the heating element 3 can extend in a zig-zag manner in the side wall 15 of the crucible 1. The arrangements of the heating element 3 shown in FIGS. 1 and 2 are exemplary and it can be arranged in the sidewall 15 in other manners.

The zig-zag extension of the heating element 3 along the side wall 15 of the crucible 1 can make the contact area between the heating element 3 and the inorganic salt 2 larger and enables the heating of the inorganic salt 2 to be more uniform, such that the inorganic salt 2 can be completely molten more quickly and the temperatures of respective portions of the inner wall 11 of the crucible 1 can be brought to a temperature required for the evaporation more quickly. Moreover, in optional embodiments, the heating element 3 may be arranged in the bottom wall of the crucible.

As shown in FIGS. 1 and 2, on the basis of the above embodiments, preferably the chamber 13 formed by the inner wall 11 and the outer wall 12 of the crucible 1 is a closed chamber. The closed chamber can ensure that the inorganic salt 2 is not exposed, so that the structure of the evaporating device can be more secure and reliable.

On the basis of the above embodiments, in a specific embodiment, the evaporation device may further comprise: a temperature sensor in contact with the outer wall 12 of the crucible 1 for sensing the temperature of the outer wall 12 of the crucible 1;

a temperature controller for controlling the heating temperature of the heating element 3 for the crucible 1 based on the temperature sensed by the temperature sensor.

The real-time detection and control of the heating temperature of the evaporation device can be realized by the temperature sensor and the temperature controller, thereby an automatic temperature control during the organic material vapor deposition process can be achieved.

Figure 3:
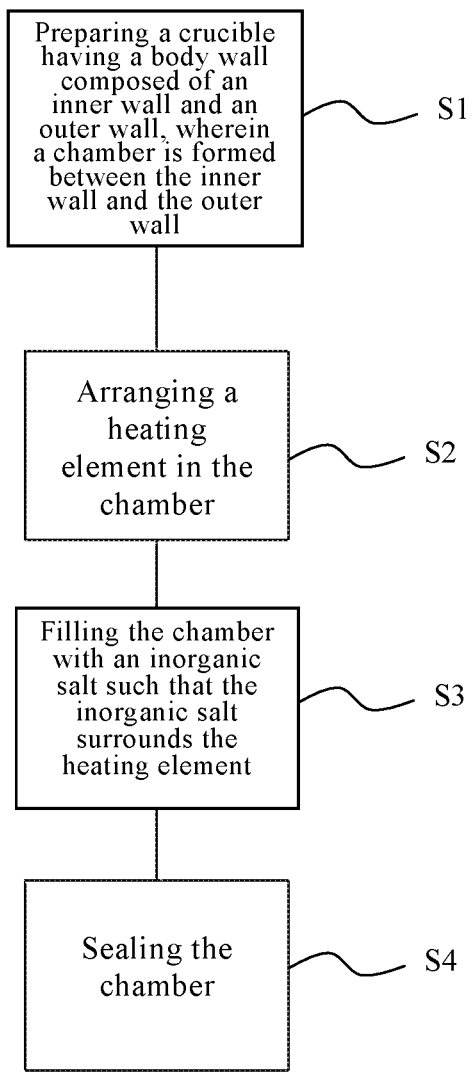
FIG. 3 illustrates a manufacturing method of the evaporation device according to embodiments of the present invention.

FIG. 3 illustrates a method of manufacturing an evaporation device according to embodiments of the present invention. The method comprises the following steps.

In step S1, a crucible having a body wall composed of an inner wall and an outer wall is prepared, and a chamber is formed between the inner wall and the outer wall. The crucible may be made of a metallic titanium material. Certainly, other materials may also be used.

In step S2, a heating element is arranged in the chamber. The heating element may be located within the side wall of the crucible or may be further located within the bottom wall of the crucible, and the heating element may extend in a zig-zag manner in the chamber.

In step S3, the chamber is filled with an inorganic salt such that the inorganic salt surrounds the heating element. The heating element may further have an insulating sheath so as to be insulated from the inorganic salt.

In step S4, the chamber is sealed. This prevents the inorganic salt from falling outside the chamber, even in the molten state.

Apparently, those skilled in the art can make various modifications and variations to the present invention without departing from the spirit and scope thereof. In this way, if these modifications and variations to the present invention fall within the scope of the claims of the present invention and equivalent technologies thereof, the present invention also intends to encompass these modifications and variations. It is to be noted that the wording "comprising" does not exclude other elements or steps not listed in the claims. Although the steps of method are described in a certain order, the steps in a process claim can be performed in parallel or in a reversed order without departing from the spirit and principle of the present invention. The wording "a" or "an" preceding an element does not exclude a plurality of such elements. The mere fact that certain measures are recited in mutually different dependent claims does not indicate that a combination of these measures cannot be used to advantage. Any reference signs in the claims should not be construed as limiting the scope.

The invention claimed is:

1. An evaporation device comprising:
   a crucible for loading an evaporation material, a body wall of the crucible comprising an inner wall and an outer wall, a chamber being formed between the inner wall and the outer wall, which chamber is filled with an inorganic salt; and
   a heating element for heating the crucible,
   wherein the heating element is embedded into the inorganic salt inside the chamber.

2. The evaporation device according to claim 1, wherein the inorganic salt is an inorganic salt mixture composed of at least two kind of inorganic salts.

3. The evaporation device according to claim 2, wherein the inorganic salt is an inorganic salt mixture composed of 50% by mass of potassium nitrate and 50% by mass of sodium nitrite.

4. The evaporation device according to claim 1, wherein the heating element is an electrical heating wire.

5. The evaporation device according to claim 4, wherein the electrical heating wire comprises a metal wire and an insulating sheath that wraps the metal wire for electrically isolating the metal wire from the inorganic salt.

6. The evaporation device according to claim 4, wherein the crucible is of a trough structure, the body wall of the crucible comprises a bottom wall and a side wall which cooperate with each other to enclose the trough structure, and the heating element is located within the side wall.

7. The evaporation device according to claim 6, wherein the heating element is further located in the bottom wall.

8. The evaporation device according to claim 6, wherein the heating element extends in a zig-zag manner within the body wall.

9. The evaporation device according to claim 1, wherein the chamber is a closed chamber.

10. The evaporation device according to claim 1, further comprising:
    a temperature sensor in contact with the outer wall of the crucible for sensing a temperature of the outer wall of the crucible;
    a temperature controller for controlling a heating temperature of the heating element for the crucible based on the temperature of the outer wall of the crucible which is sensed by the temperature sensor.

11. The evaporation device according to claim 2, further comprising:
    a temperature sensor in contact with the outer wall of the crucible for sensing a temperature of the outer wall of the crucible;
    a temperature controller for controlling a heating temperature of the heating element for the crucible based on the temperature of the outer wall of the crucible which is sensed by the temperature sensor.

12. The evaporation device according to claim 3, further comprising:
    a temperature sensor in contact with the outer wall of the crucible for sensing a temperature of the outer wall of the crucible;
    a temperature controller for controlling a heating temperature of the heating element for the crucible based on the temperature of the outer wall of the crucible which is sensed by the temperature sensor.

13. The evaporation device according to claim 1, further comprising:
    a temperature sensor in contact with the outer wall of the crucible for sensing a temperature of the outer wall of the crucible;
    a temperature controller for controlling a heating temperature of the heating element for the crucible based on the temperature of the outer wall of the crucible which is sensed by the temperature sensor.

14. The evaporation device according to claim 4, further comprising:
    a temperature sensor in contact with the outer wall of the crucible for sensing a temperature of the outer wall of the crucible;
    a temperature controller for controlling a heating temperature of the heating element for the crucible based on the temperature of the outer wall of the crucible which is sensed by the temperature sensor.

15. The evaporation device according to claim 5, further comprising:
    a temperature sensor in contact with the outer wall of the crucible for sensing a temperature of the outer wall of the crucible;
    a temperature controller for controlling a heating temperature of the heating element for the crucible based on the temperature of the outer wall of the crucible which is sensed by the temperature sensor.

16. The evaporation device according to claim 6, further comprising:
    a temperature sensor in contact with the outer wall of the crucible for sensing a temperature of the outer wall of the crucible;
    a temperature controller for controlling a heating temperature of the heating element for the crucible based on the temperature of the outer wall of the crucible which is sensed by the temperature sensor.

17. A usage of the evaporation device according to claim 1, wherein the evaporation device is used for vapor deposition of an organic material during preparing an OLED device.

18. A manufacturing method of an evaporation device, comprising:
    preparing a crucible having a body wall consisting of an inner wall and an outer wall, a chamber being formed between the inner wall and outer wall;
    arranging a heating element within the chamber;
    filling the chamber with an inorganic salt such that the inorganic salt surrounds the heating element;
    sealing the chamber.

19. The manufacturing method according to claim 18, further comprising:
    arranging a temperature sensor on the outer wall.

* * * * *